US012768952B2

(12) United States Patent
Kunishi et al.

(10) Patent No.: US 12,768,952 B2
(45) Date of Patent: Oct. 20, 2026

(54) PHOTOSENSOR AND BAND-PASS FILTER INCLUDED IN PHOTOSENSOR

(71) Applicant: ROHM Co., LTD., Kyoto (JP)

(72) Inventors: Wataru Kunishi, Kyoto (JP); Eiji Miyai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1029 days.

(21) Appl. No.: 18/050,064

(22) Filed: Oct. 27, 2022

(65) Prior Publication Data

US 2023/0136184 A1 May 4, 2023

(30) Foreign Application Priority Data

Oct. 29, 2021 (JP) ................................ 2021-177718

(51) Int. Cl.
*G01S 7/481* (2006.01)
*G01S 17/04* (2020.01)
(Continued)

(52) U.S. Cl.
CPC ............ *G01S 7/4816* (2013.01); *G01S 17/04* (2020.01); *G01S 17/08* (2013.01); *G02B 5/207* (2013.01); *H10F 77/337* (2025.01)

(58) Field of Classification Search
CPC .................................................... G01S 7/4816
See application file for complete search history.

(56) References Cited

U.S. PATENT DOCUMENTS

2003/0072009 A1* 4/2003 Domash ................ G01J 3/0286 356/519
2017/0117421 A1* 4/2017 Okihara ................ H10F 77/337
2022/0066030 A1* 3/2022 Taguchi .............. G02F 1/13718

FOREIGN PATENT DOCUMENTS

JP 2004537750 A 12/2004
JP 2012-185107 9/2012
(Continued)

OTHER PUBLICATIONS

JP_2013063203 merged translation (Year: 2013).*
(Continued)

*Primary Examiner* — Marisa V Conlon
(74) *Attorney, Agent, or Firm* — CHIP Law Group

(57) ABSTRACT

Provided is a photosensor that measures a state of a detection subject, the photosensor including a light source that emits irradiation light in a wavelength band including a specific peak wavelength to the detection subject, a band-pass filter that allows the irradiation light reflected by the detection subject to be selectively transmitted through the band-pass filter, a light receiver that receives the irradiation light transmitted through the band-pass filter, and a measuring device that measures the state of the detection subject by using the light received by the light receiver. The light source has a temperature characteristic in which the specific wavelength peak of the emitted irradiation light shifts by a first wavelength shift amount depending on an environmental temperature. The band-pass filter has a temperature characteristic in which the specific wavelength peak of the emitted irradiation light shifts by a second wavelength shift amount depending on the environmental temperature. A shape and a material of the band-pass filter are selected in such a manner that the second wavelength shift amount is equivalent to the first wavelength shift amount.

11 Claims, 7 Drawing Sheets

(51) Int. Cl.
*G01S 17/08* (2006.01)
*G02B 5/20* (2006.01)
*H10F 77/30* (2025.01)

(56) References Cited

FOREIGN PATENT DOCUMENTS

| | | | | | |
|---|---|---|---|---|---|
| JP | 2013063203 | A | * | 4/2013 | |
| WO | WO-2005078512 | A1 | * | 5/2005 | ............. G02F 1/025 |
| WO | WO-2014050612 | A1 | * | 4/2014 | ........... A61B 5/6815 |
| WO | 2020230698 | A1 | | 11/2020 | |

OTHER PUBLICATIONS

WO_2005078512 merged translation (Year: 2005).*
WO_2014050612 merged translation (Year: 2014).*
Office Action for related Japanese Application JP 2021-177718 mailed Sep. 30, 2025.

* cited by examiner

PHOTOSENSOR AND BAND-PASS FILTER INCLUDED IN PHOTOSENSOR

CROSS REFERENCE TO RELATED APPLICATIONS

This application claims priority benefit of Japanese Patent Application No. JP 2021-177718 filed in the Japan Patent Office on Oct. 29, 2021. Each of the above-referenced applications is hereby incorporated herein by reference in its entirety.

BACKGROUND

The present disclosure relates to a photosensor and a band-pass filter included in a photosensor.

It is known that a vertical cavity surface emitting laser (VCSEL) is used for a light source of a photosensor.

An example of the related art is disclosed in Japanese Patent Laid-open No. 2012-185107.

SUMMARY

However, in the VCSEL, the wavelength of emitted light shifts when the environmental temperature changes. Thus, when light with a predetermined wavelength is received, a band-pass filter made in consideration of temperature variation is necessary. Therefore, there is a possibility that a noise component becomes large due to widening of the pass band of the band-pass filter.

It is desirable that the present disclosure provides a photosensor and a band-pass filter that can suppress a noise component of received light.

According to one example of the present disclosure, provided is a photosensor that measures a state of a detection subject, the photosensor including a light source that emits irradiation light in a wavelength band including a specific peak wavelength to the detection subject, a band-pass filter that allows the irradiation light reflected by the detection subject to be selectively transmitted through the band-pass filter, a light receiver that receives the irradiation light transmitted through the band-pass filter, and a measuring device that measures the state of the detection subject by using the light received by the light receiver. The light source has a temperature characteristic in which the specific wavelength peak of the emitted irradiation light shifts by a first wavelength shift amount depending on an environmental temperature. The band-pass filter has a temperature characteristic in which the specific wavelength peak of the emitted irradiation light shifts by a second wavelength shift amount depending on the environmental temperature. In the photosensor, a shape and a material of the band-pass filter are selected in such a manner that the second wavelength shift amount is equivalent to the first wavelength shift amount.

Furthermore, according to another example of the present disclosure, provided is a band-pass filter included in the photosensor according to claim 1, the band-pass filter including a base, a first layer in which a first refractive index layer is stacked on the base and a first stack layer is stacked on the first refractive index layer in a thickness direction, a plurality of second layers in which a first cavity layer having a second refractive index higher than a first refractive index is stacked over the first layer, in which the first refractive index layer is stacked on the first cavity layer, and in which a second stack layer is stacked on the first refractive index layer, a third layer in which a second cavity layer having the second refractive index is stacked on an uppermost layer in the plurality of second layers, in which the first refractive index layer is stacked on the second cavity layer, and in which a third stack layer is stacked on the first refractive index layer, and a cap layer stacked on the third layer. Shapes and materials of the first layer, the second layers, and the third layer are selected in such a manner that the second wavelength shift amount is equivalent to the first wavelength shift amount.

According to the present disclosure, a photosensor that can suppress a noise component of received light can be provided. Furthermore, a band-pass filter used for the photosensor can be provided.

DETAILED DESCRIPTION OF THE PREFERRED EMBODIMENTS

Next, embodiments will be described with reference to the drawings. In description of the drawings to be explained below, the same or similar part is given the same or similar reference sign. However, it should be noted that the drawings are schematic ones and a relation between a thickness and planar dimensions of each constituent part, and other numerical relations are different from actual ones. Therefore, specific thicknesses and dimensions should be determined in consideration of the following explanation. Further, it is obvious that a part different in the mutual dimensional relationship or ratio is included also between the drawings.

Moreover, the embodiments provided below are what exemplify devices and methods for embodying technical ideas and are not what specify the material, shape, structure, arrangement, and other elements of each constituent part. Various changes can be added to the embodiments in the scope of claims.

A photosensor according to the present disclosure will be described.

First Embodiment (Configuration of Photosensor)

Figure 1:
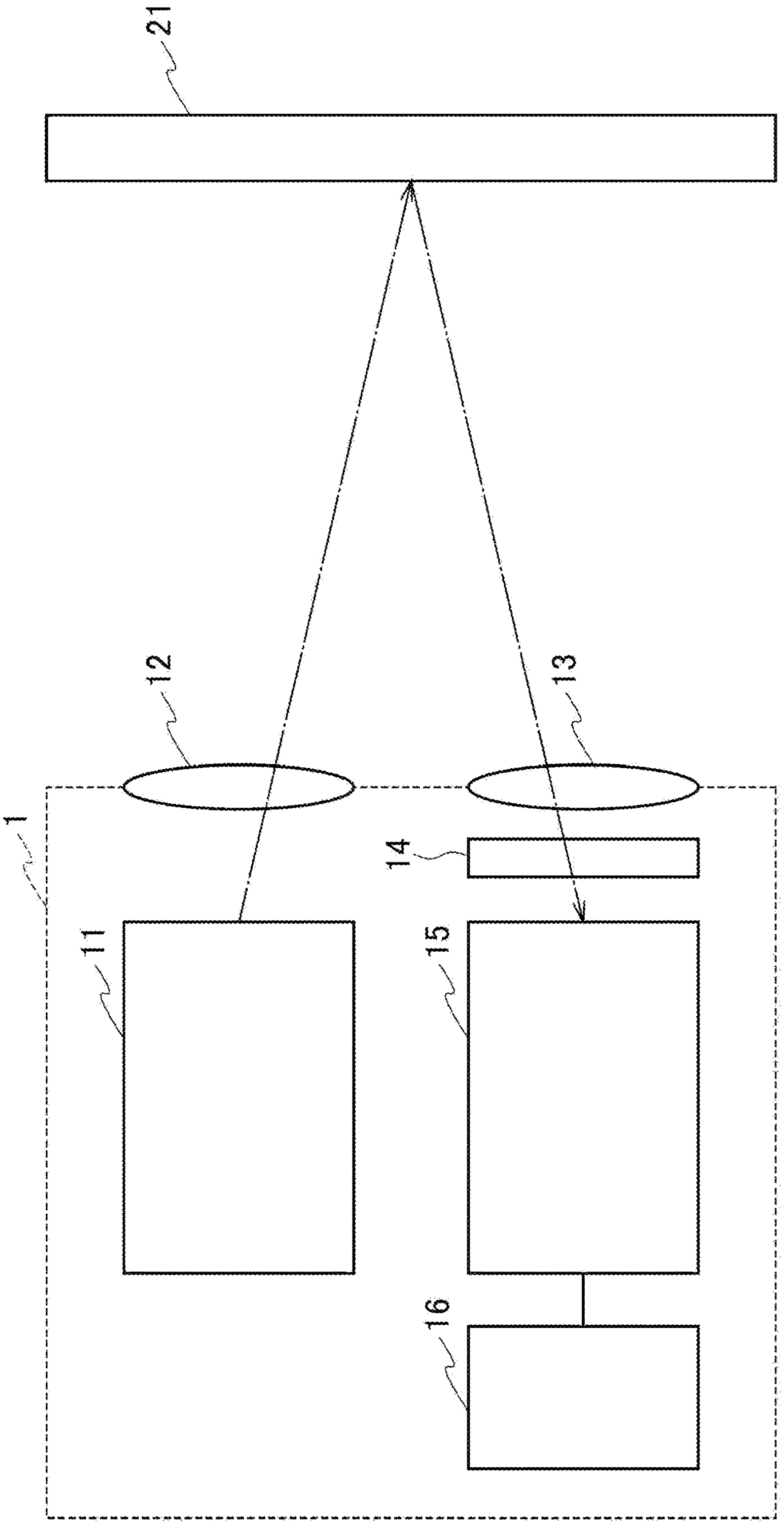
FIG. 1 is a configuration diagram illustrating a photosensor according to a first embodiment.

FIG. 1 is one example of a configuration diagram of a photosensor according to a first embodiment.

As illustrated in FIG. 1, a photosensor 1 according to the present embodiment includes a light source 11, a light projecting lens 12, a light receiving lens 13, a band-pass filter 14, a light receiver 15, and a measuring device 16.

For example, the photosensor 1 irradiates a detection subject 21 with light and receives reflected light. Specifically, in the photosensor 1, the light source 11 emits light to irradiate the detection subject 21 with the light through the light projecting lens 12 as illustrated in FIG. 1. Further, in the photosensor 1, the light receiver 15 receives the light reflected by the detection subject 21 through the light receiving lens 13 and the band-pass filter 14. Moreover, the photosensor 1 measures the distance between the photosensor 1 and the detection subject 21 by the measuring device 16 with use of the received light. The photosensor 1 may use a triangulation system to analyze the light reception position of the light receiver 15 and measure the distance, for example. In addition, the photosensor 1 may use a time-of-flight system to measure the time until light is received through being reflected by the detection subject 21 and measure the distance by calculation processing, for example. Alternatively, the presence or absence of the detection subject 21 around the photosensor 1 may be determined based on the light reception intensity of the light receiver 15. In the following description, the distance between the photosensor 1 and the detection subject 21, the presence or absence of the detection subject 21 around the photosensor 1, or other states, each serving as information indicating the state of the relation between the photosensor 1 and the detection subject 21, will be referred to also as "the state of the detection subject 21."

The light source 11 emits light with a wavelength of 800 to 1000 nm, for example. Specifically, the light source 11 may include a vertical cavity surface emitting laser (VCSEL) that emits light with a wavelength of 920 to 970 nm, for example. The light source 11 may include a distributed feedback (DFB) laser or a photonic crystal laser. In the following description, the light source 11 will be explained as a vertical cavity surface emitting laser.

The light source 11 has a temperature characteristic in which a specific wavelength peak of emitted light shifts by a first wavelength shift amount, depending on the environmental temperature. The first wavelength shift amount of the light source 11 is 0.07 nm/° C., for example. Further, the light source 11 emits irradiation light in a wavelength band including the specific peak wavelength to a detection subject, for example. The environmental temperature refers to the ambient temperature of the light source 11 here.

The light projecting lens 12 focuses the light emitted from the light source 11 to execute irradiation. The light projecting lens 12 may convert the light emitted by the light source 11 to substantially collimated light flux.

The light receiving lens 13 receives the irradiation light reflected by the detection subject 21 and focuses the light. The light receiving lens 13 may convert the irradiation light reflected by the detection subject 21 to substantially collimated light flux.

The band-pass filter 14 allows the irradiation light reflected by the detection subject 21 to be selectively transmitted through the band-pass filter 14. That is, the band-pass filter 14 cuts off ambient light in a wavelength band that does not include the specific peak wavelength. The ambient light is light incident on the light receiver 15 from the external environment and is present in a wide wavelength band. The band-pass filter 14 may be disposed between the detection subject 21 and the light receiving lens 13, instead of being disposed between the light receiving lens 13 and the light receiver 15. That is, the irradiation light reflected by the detection subject 21 may be transmitted through the band-pass filter 14 first, and the irradiation light may be focused by the light receiving lens 13. Details of the configuration of the band-pass filter 14 will be described later.

The light receiver 15 receives the irradiation light reflected by the detection subject 21. The light receiver 15 may include a photodiode, for example.

The measuring device 16 measures the state of the detection subject 21 by using the light received by the light receiver 15. Specifically, the measuring device 16 measures the distance between the photosensor 1 and the detection subject 21 by using the light received by the light receiver 15. The measuring device 16 may analyze the position of the received light by using the light received by the light receiver 15. Further, the measuring device 16 may measure the time from emission of light by the light source 11 to reception of the light by the light receiver 15 through reflection by the detection subject 21 and measure the distance by calculation processing. Alternatively, the presence or absence of the detection subject 21 around the photosensor 1 may be determined based on the light reception intensity of the light receiver 15.

(Configuration of Band-Pass Filter)

Next, the configuration of a band-pass filter 14A according to the present embodiment will be described.

Figure 2:
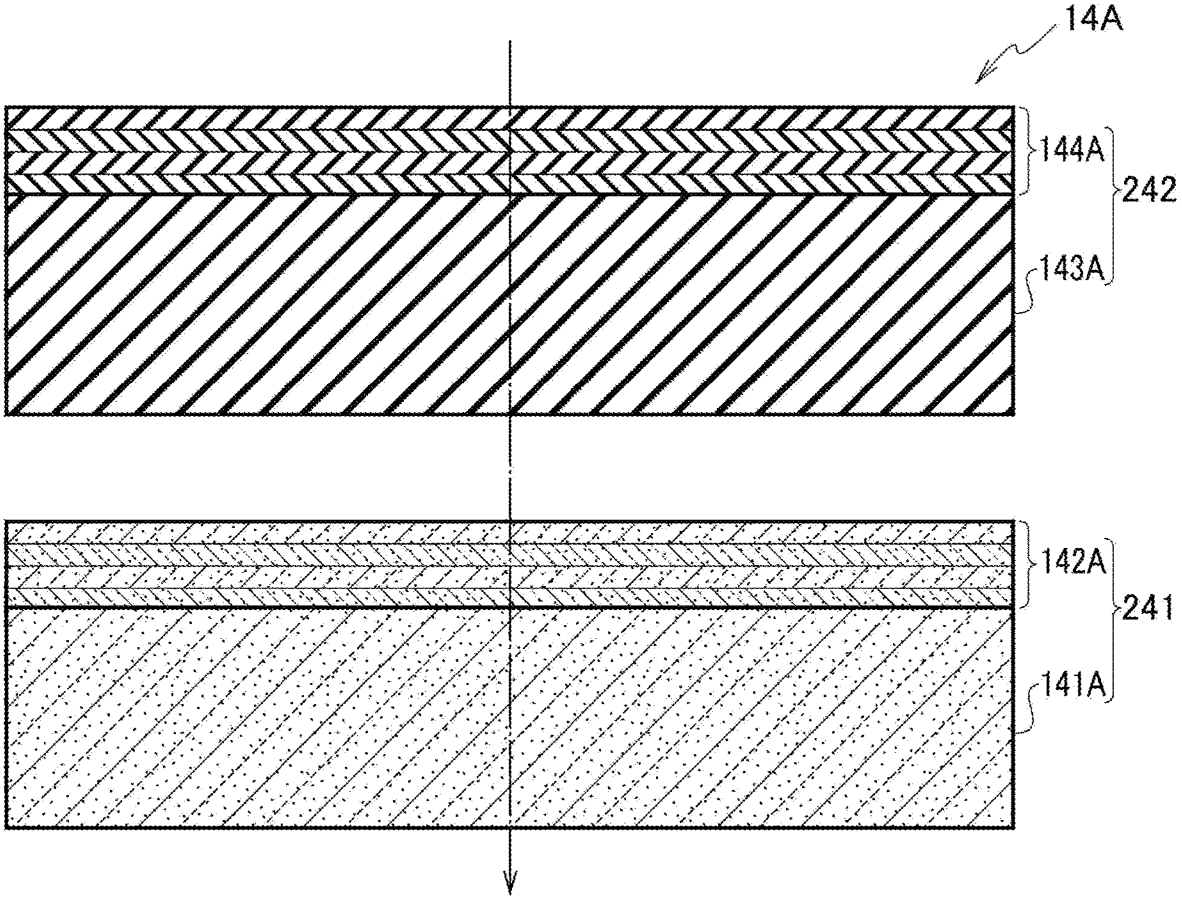
FIG. 2 is a configuration diagram illustrating a band-pass filter according to the present embodiment.
Figure 3:
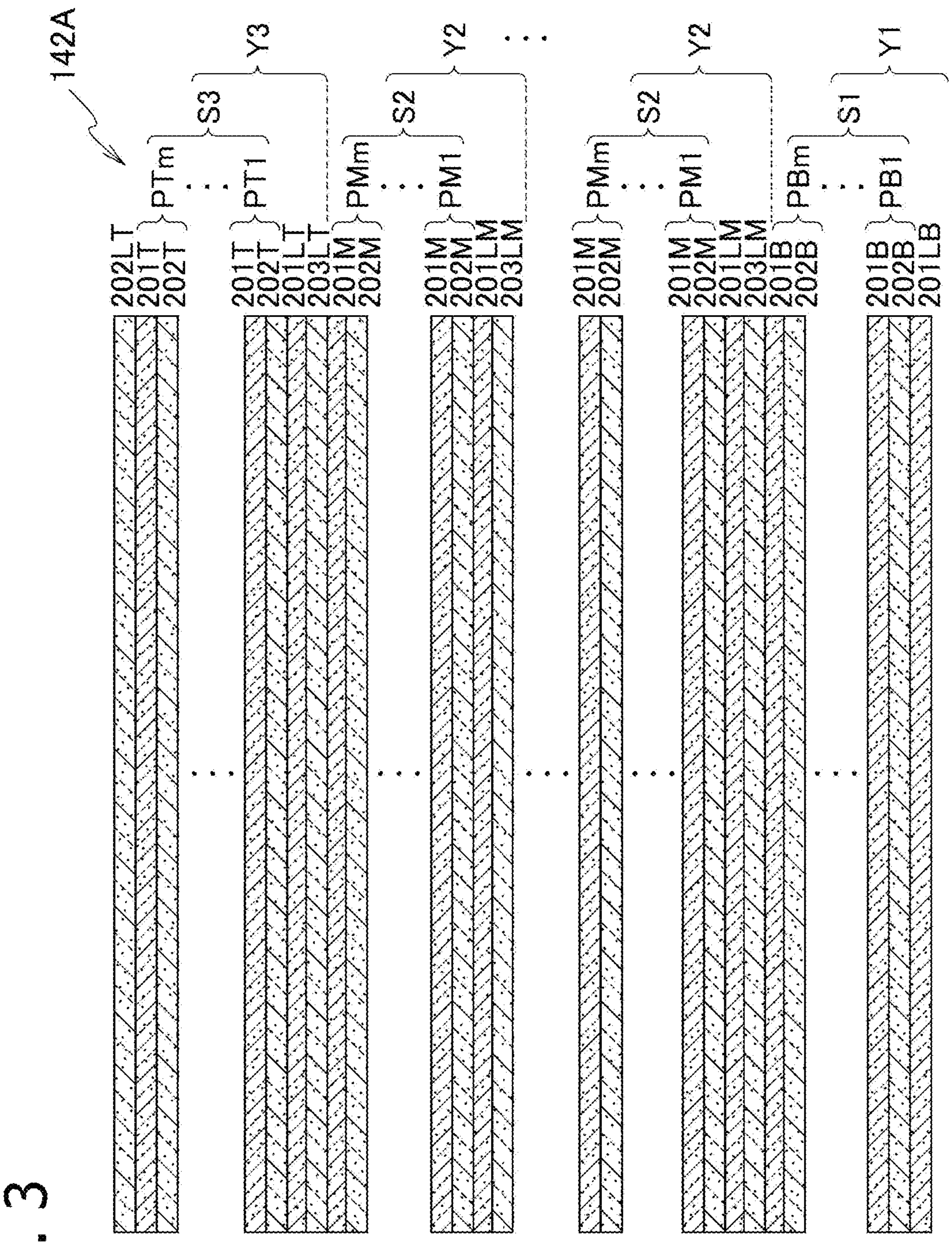
FIG. 3 is a configuration diagram illustrating a detailed structure of a semiconductor multilayer film according to the present embodiment.

FIG. 2 is one example of a configuration diagram illustrating the band-pass filter 14A according to the present embodiment. FIG. 3 is one example of a configuration diagram illustrating the detailed structure of a semiconductor multilayer film 142A according to the present embodiment.

As illustrated in FIG. 2, the band-pass filter 14A according to the present embodiment includes a semiconductor band-pass filter 241 and a dielectric band-pass filter 242. In FIG. 2, the semiconductor band-pass filter 241 is disposed on the side of the light receiver 15, and the dielectric band-pass filter 242 is disposed on the side of the detection subject 21. The semiconductor band-pass filter 241 may be disposed on the side of the detection subject 21, and the dielectric band-pass filter 242 may be disposed on the side of the light receiver 15.

The semiconductor band-pass filter 241 and the dielectric band-pass filter 242 allow irradiation light reflected by the detection subject 21 to be selectively transmitted through them. That is, as illustrated in FIG. 2, the irradiation light reflected by the detection subject 21 is transmitted through the semiconductor band-pass filter 241 after being transmitted through the dielectric band-pass filter 242. Further, the semiconductor band-pass filter 241 and the dielectric band-pass filter 242 cut off ambient light. The reason that the band-pass filter 14A includes the dielectric band-pass filter 242 is that ambient light is cut off in a wavelength band of a wider range than the range when the semiconductor band-pass filter 241 is used alone.

The semiconductor band-pass filter 241 has a temperature characteristic in which a specific wavelength peak shifts by a second wavelength shift amount, depending on the environmental temperature. The environmental temperature refers to the ambient temperature of the semiconductor band-pass filter here. The shift amount of the wavelength that shifts depending on the temperature regarding the semiconductor band-pass filter 241 is referred to as the second wavelength shift amount. The second wavelength shift amount is adjusted through setting of a configuration shape and materials of the semiconductor band-pass filter 241. In the semiconductor band-pass filter 241, the configuration shape and the materials of the semiconductor band-pass filter 241 are selected in such a manner that the second wavelength shift amount that occurs depending on the environmental temperature is equivalent to the first wavelength shift amount that occurs depending on the environmental temperature of the light source 11. Specifically, when the first wavelength shift amount that occurs depending on the environmental temperature of the light source 11 is 0.07 nm/° C., it suffices that the photosensor 1 uses the band-pass filter 14 including the semiconductor band-pass filter 241 in which the second wavelength shift amount is 0.07 nm/° C. on the basis of the configuration shape and the materials of the semiconductor band-pass filter 241.

As illustrated in FIG. 2, the semiconductor band-pass filter 241 includes a semiconductor substrate 141A that is one example of the base and a semiconductor multilayer film 142A that is one example of a first semiconductor multilayer film and in which plural semiconductor layers having semiconductor materials are stacked. Specifically, the semiconductor band-pass filter 241 has a structure in which the semiconductor multilayer film 142A in which the plural semiconductor layers having the semiconductor materials are stacked is formed on the semiconductor substrate 141A. An anti-reflection film (anti-reflection coating: AR coating) may be formed on the surfaces of the face oriented toward the side of the light receiver 15 in the semiconductor substrate 141A and the face oriented toward the side of the detection subject 21 in the semiconductor multilayer film 142A.

It suffices that the semiconductor substrate 141A is at least either one substrate of a single-element semiconductor substrate or a compound semiconductor substrate, for example. As the material of the single-element semiconductor substrate, for example, silicon (Si), germanium (Ge), or other compounds may be used. Further, as the material of the compound semiconductor substrate, for example, gallium arsenide (GaAs), gallium phosphide (GaP), gallium nitride (GaN), indium phosphide (InP), silicon carbide (Sic), zinc oxide (ZnO), cadmium telluride (CdTe), zinc selenide (ZnSe), or other compounds may be used.

As illustrated in FIG. 3, the semiconductor multilayer film 142A includes a first layer Y1, plural second layers Y2, a third layer Y3, and a cap layer 202LT, for example. For the semiconductor multilayer film 142A, the second wavelength shift amount that occurs depending on the environmental temperature is set based on the film thickness that is one example of the shape and the refractive index that is one example of the property of the material regarding the individual semiconductor layers stacked in the first layer Y1, the second layers Y2, the third layer Y3, and the cap layer 202LT.

For example, the first layer Y1 includes a first refractive index layer 201LB that is one example of a first semiconductor layer stacked on the semiconductor substrate 141A that is one example of the base and a first stack layer S1 stacked on the first refractive index layer 201LB. In the following description, one example of the first semiconductor layer will be referred to also as the first refractive index layer 201LB.

The first stack layer S1 includes plural first layered structures (PB1, PB2, . . . , PBm). Specifically, the first layered structure is a structure in which a first refractive index layer 201B that is one example of a third semiconductor layer is stacked on a second refractive index layer 202B that is one example of a second semiconductor layer and has a higher refractive index than the first refractive index layer and the second refractive index layer 202B and the first refractive index layer 201B pair up. In the following description, the structure in which the second refractive index layer 202B and the first refractive index layer 201B pair up will be referred to as the first layered structure.

The first refractive index layer 201LB and the first refractive index layer 201B have a lower refractive index than the second refractive index layer 202B. Specifically, for example, aluminum gallium arsenide ($Al_{0.85}GaAs$) having a refractive index n=3.073 may be used for the first refractive index layer 201LB and the first refractive index layer 201B. Further, for example, gallium arsenide (GaAs) having a refractive index n=3.589 may be used for the second refractive index layer 202B. Although the aluminum gallium arsenide having a refractive index n=3.073 and the gallium arsenide having a refractive index n=3.589 are cited as one example, the materials are not limited thereto.

It suffices that the film thicknesses of the first refractive index layer 201LB, the second refractive index layer 202B, and the first refractive index layer 201B are approximately 40 to 100 nm, for example.

For example, the second layer Y2 includes a first cavity layer 203LM that is one example of a fourth semiconductor layer stacked on the first layer Y1 and has a higher refractive index than the first refractive index layer, a first refractive index layer 201LM that is one example of a fifth semiconductor layer stacked on the first cavity layer 203LM, and a second stack layer S2 stacked on the first refractive index layer 201LM. In the following description, the fourth semiconductor layer having a higher refractive index than the first refractive index layer will be referred to also as the first cavity layer 203LM.

The second stack layer S2 includes plural first layered structures (PM1, PM2, . . . , PMm). Specifically, the first layered structure (PM1, PM2, . . . , PMm) is a structure in which a first refractive index layer 201M that is one example of a seventh semiconductor layer is stacked on a second refractive index layer 202M that is one example of a sixth semiconductor layer such that the second refractive index layer 202M and the first refractive index layer 201M pair up. In the following description, the structure in which the second refractive index layer 202M and the first refractive index layer 201M pair up will be referred to also as the first layered structure.

The first cavity layer 203LM and the second refractive index layer 202M have a higher refractive index than the first refractive index layer 201LM and the first refractive index layer 201M. Specifically, for example, gallium arsenide (GaAs) having a refractive index n=3.589 may be used for the first cavity layer 203LM and the second refractive index layer 202M. For the first refractive index layer 201LM and the first refractive index layer 201M, for example, aluminum gallium arsenide ($Al_{0.85}GaAs$) having a refractive index n=3.073 may be used. Although the aluminum gallium arsenide having a refractive index n=3.073 and the gallium arsenide having a refractive index n=3.589 are cited as one example, the materials are not limited thereto.

It suffices that the film thicknesses of the first refractive index layer 201LM, the second refractive index layer 202M, and the first refractive index layer 201M are approximately 40 to 100 nm, for example. Further, it suffices that the film thickness of the first cavity layer 203LM is approximately 100 to 700 nm, for example.

For example, the third layer Y3 includes a second cavity layer 203LT that is one example of an eighth semiconductor layer stacked on the second layer Y2 and has a higher refractive index than the first refractive index layer, a first refractive index layer 201LT that is one example of a ninth semiconductor layer stacked on the second cavity layer 203LT, and a third stack layer S3 stacked on the first refractive index layer 201LT. In the following description, the eighth semiconductor layer having a higher refractive index than the first refractive index layer will be referred to also as the second cavity layer 203LT.

The third stack layer S3 includes plural first layered structures (PT1, PT2, . . . , PTm). Specifically, the first layered structure (PT1, PT2, . . . , PTm) is a structure in which a first refractive index layer 201T that is one example of an eleventh semiconductor layer is stacked on a second refractive index layer 202T that is one example of a tenth semiconductor layer such that the second refractive index layer 202T and the first refractive index layer 201T pair up. In the following description, the structure in which the second refractive index layer 202T and the first refractive index layer 201T pair up will be referred to as the first layered structure.

The second cavity layer 203LT and the second refractive index layer 202T have a higher refractive index than the first refractive index layer 201LT and the first refractive index layer 201T. Specifically, for example, gallium arsenide (GaAs) having a refractive index n=3.589 may be used for the second cavity layer 203LT and the second refractive index layer 202T. For the first refractive index layer 201LT and the first refractive index layer 201T, for example, aluminum gallium arsenide ($Al_{0.85}GaAs$) having a refractive index n=3.073 may be used. Although the aluminum gallium arsenide having a refractive index n=3.073 and the gallium arsenide having a refractive index n=3.589 are cited as one example, the materials are not limited thereto.

It suffices that the film thicknesses of the first refractive index layer 201LT, the second refractive index layer 2021, and the first refractive index layer 201T are approximately 40 to 100 nm, for example. Further, it suffices that the film thickness of the second cavity layer 203LT is approximately 100 to 700 nm, for example.

The cap layer 202LT is a semiconductor layer that is stacked on the third layer and has a higher refractive index than the first refractive index layer. For the cap layer 202LT, for example, gallium arsenide (GaAs) having a refractive index n=3.589 may be used. Although the gallium arsenide (GaAs) having a refractive index n=3.589 is cited as one example, the material is not limited thereto. Further, it suffices that the film thickness of the cap layer 202LT is approximately 100 to 700 nm, for example.

As illustrated in FIG. 2, the dielectric band-pass filter 242 includes a dielectric substrate 143A and a dielectric multilayer film 144A in which plural dielectric layers having dielectric materials are stacked. Specifically, the dielectric band-pass filter 242 has a structure in which the dielectric multilayer film 144A in which the plural dielectric layers having the dielectric materials are stacked is formed on the dielectric substrate 143A. An anti-reflection film (AR coating) may be formed on the surfaces of the face oriented toward the side of the light receiver 15 in the dielectric substrate 143A and the face oriented toward the side of the detection subject 21 in the dielectric multilayer film 144A. The internal configuration of the dielectric band-pass filter 242 is publicly known, and therefore, description of the internal configuration is omitted.

Figure 4:
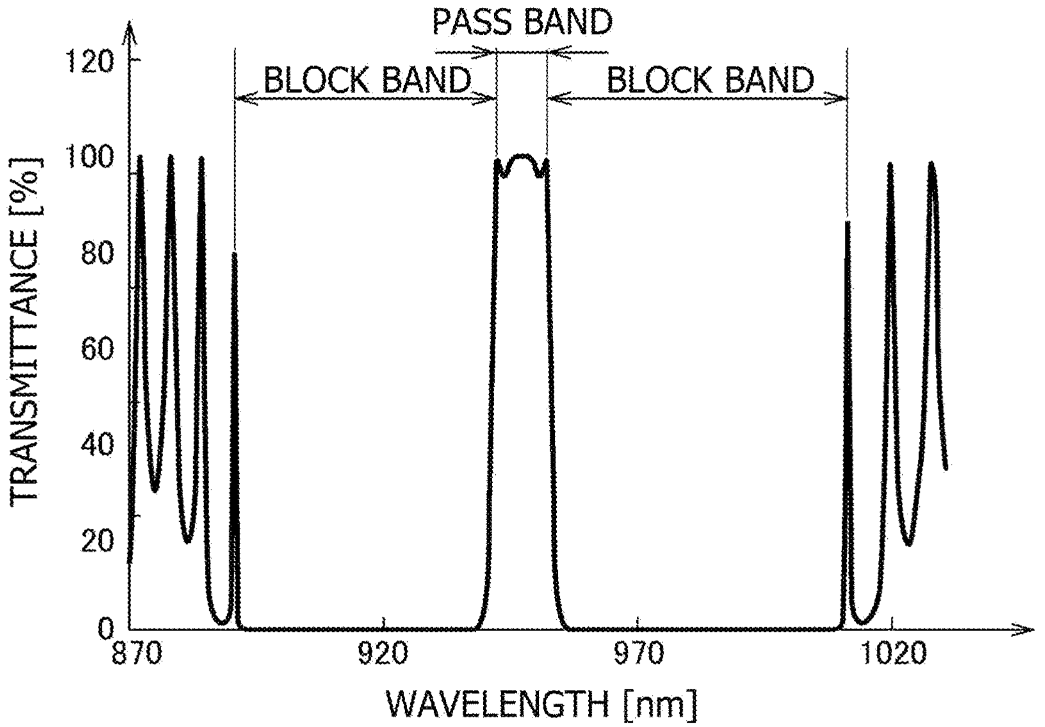
FIG. 4 is a characteristic diagram illustrating a relation between a pass band and block bands of a semiconductor band-pass filter according to the present embodiment.
Figure 5:
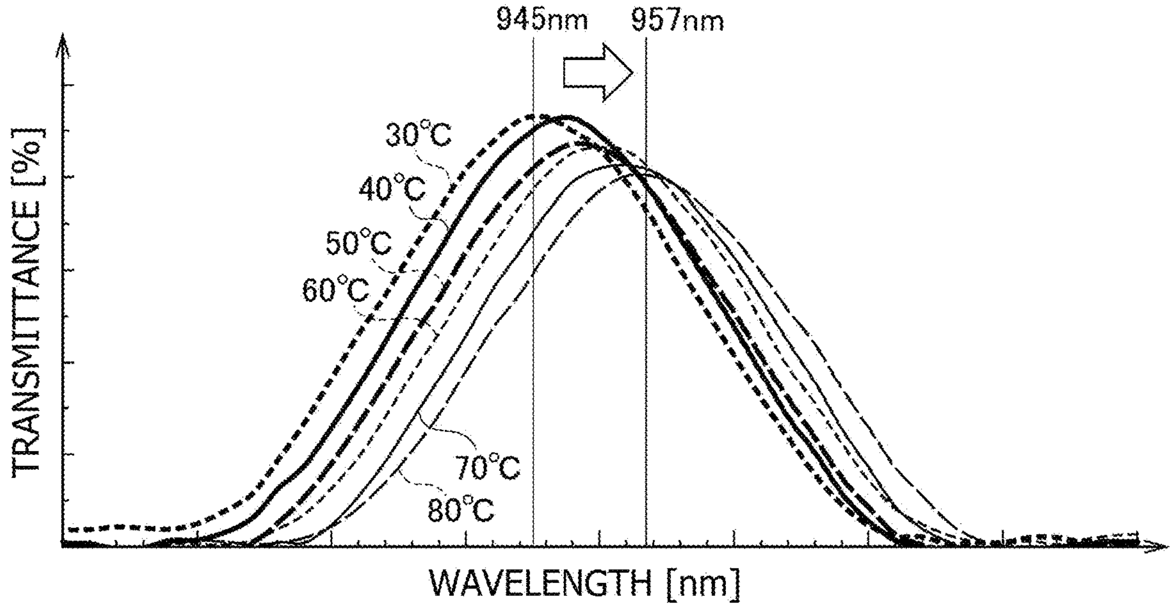
FIG. 5 is a characteristic diagram illustrating a relation between temperature and transmittance with respect to irradiation light of the semiconductor band-pass filter according to the present embodiment.
Figure 6:
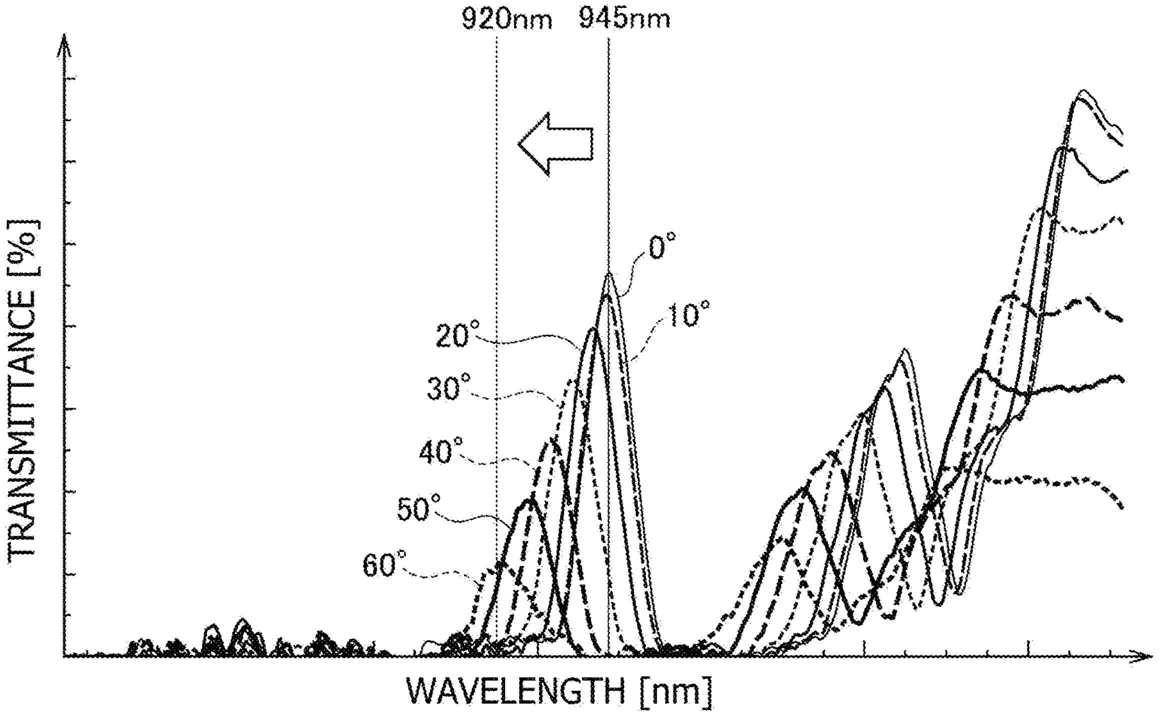
FIG. 6 is a characteristic diagram illustrating a relation between an angle of incidence and the transmittance with respect to the irradiation light of the semiconductor band-pass filter according to the present embodiment.

FIG. 4 is a characteristic diagram illustrating a relation between a pass band and block bands of the semiconductor band-pass filter 241 according to the present embodiment. FIG. 5 is a characteristic diagram illustrating a relation between temperature and transmittance with respect to irradiation light of the semiconductor band-pass filter 241 according to the present embodiment. FIG. 6 is a characteristic diagram illustrating a relation between an angle of incidence and the transmittance with respect to the irradiation light of the semiconductor band-pass filter 241 according to the present embodiment.

In FIG. 4, the relation between the pass band and the block bands of the semiconductor band-pass filter 241 indicates that irradiation light reflected by the detection subject 21 is transmitted through the pass band of a wavelength band of approximately 935 to 955 nm and is cut off by the block bands of wavelength bands of 935 nm or less and 955 nm or more. That is, as illustrated in FIG. 4, the semiconductor band-pass filter 241 allows the transmission of the irradiation light by the wavelength band including a specific peak wavelength (here, wavelength 945 nm) and cuts off ambient light in the block bands. Ambient light in wavelength bands of 890 nm or less and 1010 nm or more is cut off by the dielectric band-pass filter 242.

In FIG. 5, the relation between the temperature and the transmittance with respect to the irradiation light of the semiconductor band-pass filter 241 indicates that the peak wavelength of the irradiation light reflected by the detection subject 21 shifts depending on the environmental temperature. Specifically, regarding the irradiation light, for example, the peak wavelength is 945 nm when the environmental temperature is 30° C., whereas the peak wavelength shifts to 957 nm when the environmental temperature is 80° C. That is, the semiconductor band-pass filter 241 has the second wavelength shift amount of 0.077 nm/° C. by which the specific wavelength peak of the light that can be transmitted shifts depending on the environmental temperature.

In FIG. 6, the relation between the angle of incidence and the transmittance with respect to the irradiation light of the semiconductor band-pass filter 241 indicates that the peak wavelength of the irradiation light reflected by the detection subject 21 shifts depending on the angle of incidence with respect to the irradiation light.

Specifically, regarding the irradiation light, for example, the peak wavelength is 945 nm when the angle of incidence is 0°, whereas the peak wavelength shifts to 920 nm when the angle of incidence is 60°. That is, in the semiconductor band-pass filter 241, the specific wavelength peak of the light that can be transmitted shifts depending on light incident from an oblique direction as the irradiation light. The shift amount depending on the angle of incidence regarding the semiconductor band-pass filter 241 is 15 nm/° when the angle of incidence is 40°, for example. This shift amount is smaller than a shift amount of 89.4 nm/° when the angle of incidence is 40° regarding the dielectric band-pass filter, for example. The light incident from an oblique direction here is light whose angle of incidence is 1° to 90°.

As above, in the photosensor 1 of the first embodiment, for the light source 11 having a temperature characteristic in which the specific wavelength peak of emitted irradiation light shifts by the first wavelength shift amount depending on the environmental temperature, the band-pass filter 14 having a temperature characteristic in which the specific wavelength peak shifts by the second wavelength shift amount depending on the environmental temperature is disposed. Further, the configuration shape and materials of the band-pass filter 14 are selected in such a manner that the second wavelength shift amount is equivalent to the first wavelength shift amount. Therefore, according to the photosensor 1 of the first embodiment, when the first wavelength shift amount by which the specific wavelength peak of emitted irradiation light shifts occurs depending on the environmental temperature, the band of transmission can be set narrow due to the configuration in which the band-pass filter 14 having the semiconductor band-pass filter 241 has the temperature characteristic in which the specific wavelength peak shifts by the second wavelength shift amount equivalent to the first wavelength shift amount. Thus, the noise component of the received light can be suppressed.

Moreover, in the photosensor 1 of the first embodiment, the shift amount depending on the angle of incidence of the received light is small relative to that in the dielectric band-pass filter due to the inclusion of the band-pass filter 14 having the semiconductor band-pass filter 241. Therefore, the band of transmission becomes less liable to change, and the noise component of the received light can be suppressed.

In the photosensor 1 of the first embodiment, due to the suppression of the noise component of the received light, the accuracy of the measurement value of the distance between the photosensor 1 and the detection subject 21 becomes high. Thus, the photosensor 1 of the first embodiment can accurately measure the distance between the photosensor 1 and the detection subject 21. Moreover, due to the suppression of the noise component of the received light, sensing of the detection subject is enabled even under a condition that the intensity of the irradiation light is weak.

Second Embodiment (Configuration of Band-Pass Filter)

A band-pass filter 14B according to a second embodiment will be described.

Figure 7:
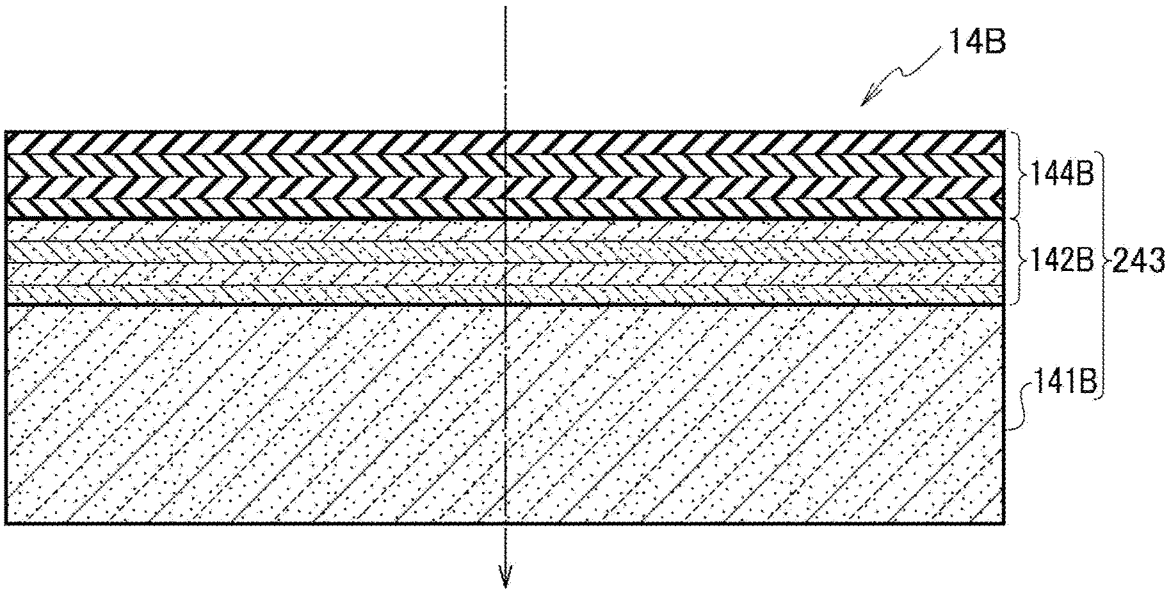
FIG. 7 is a configuration diagram illustrating a band-pass filter according to a second embodiment.

FIG. 7 is one example of a configuration diagram illustrating the band-pass filter 14B according to the second embodiment.

The band-pass filter 14B according to the second embodiment has a different configuration with respect to the band-pass filter 14A of FIG. 2. Specifically, the band-pass filter 14A according to the first embodiment includes the semiconductor band-pass filter 241 and the dielectric band-pass filter 242, whereas the band-pass filter 14B according to the second embodiment includes a semiconductor band-pass filter 243 as illustrated in FIG. 7. The configuration of the photosensor 1 other than the band-pass filter 14B according to the second embodiment is the same as the photosensor 1 of the first embodiment.

Specifically, the semiconductor band-pass filter 243 includes a semiconductor substrate 141B that is one example of the base, a semiconductor multilayer film 142B that is one example of the first semiconductor multilayer film and in which plural semiconductor layers having semiconductor materials are stacked, and a dielectric multilayer film 144B in which plural dielectric layers having dielectric materials are stacked.

That is, the semiconductor band-pass filter 243 has a structure in which the semiconductor multilayer film 142B in which the plural semiconductor layers having the semiconductor materials are stacked is formed on the semiconductor substrate 141B and the dielectric multilayer film 144B in which the plural dielectric layers having the dielectric materials are stacked is formed on the semiconductor multilayer film 142B. An anti-reflection film (AR coating) may be formed on the surfaces of the face oriented toward the side of the light receiver 15 in the semiconductor substrate 141B and the face oriented toward the side of the detection subject 21 in the dielectric multilayer film 144B.

Effects of the photosensor 1 having the semiconductor band-pass filter 243 according to the second embodiment are similar to those of the photosensor 1 according to the first embodiment.

Further, according to the semiconductor band-pass filter 243 of the second embodiment, integration into one band-pass filter is allowed through forming the dielectric multilayer film 144B on the semiconductor multilayer film 142B. Moreover, the semiconductor band-pass filter 243 can suppress the noise component of the received light by cutting off ambient light in a wavelength band in which cutoff by the semiconductor multilayer film 142B is not possible by use of the dielectric multilayer film 144B having a high-pass filter or a low-pass filter.

Modification Example of Second Embodiment (Configuration of Band-Pass Filter)

A band-pass filter 14C according to a modification example of the second embodiment will be described.

Figure 8:
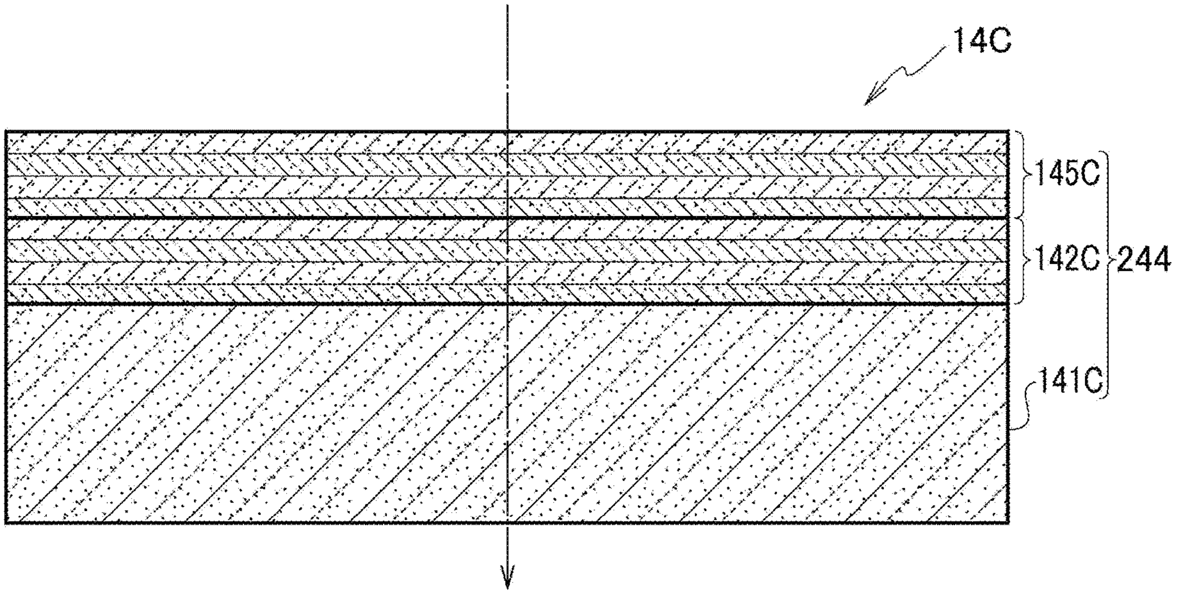
FIG. 8 is a configuration diagram illustrating a band-pass filter according to a modification example of the second embodiment.

FIG. 8 is one example of a configuration diagram illustrating the band-pass filter 14C according to the modification example of the second embodiment.

The band-pass filter 14C according to the modification example of the second embodiment has a different configuration with respect to the band-pass filter 14B according to the second embodiment of FIG. 7. Specifically, the band-pass filter 14B according to the second embodiment includes the semiconductor substrate 141B that is one example of the base, the semiconductor multilayer film 142B in which plural semiconductor layers having semiconductor materials are stacked, and the dielectric multilayer film 144B in which plural dielectric layers having dielectric materials are stacked, whereas the band-pass filter 14C according to the modification example of the second embodiment includes a semiconductor band-pass filter 244 as illustrated in FIG. 8. The configuration of the photosensor 1 other than the band-pass filter 14C according to the modification example of the second embodiment is the same as the photosensor 1 according to the first embodiment.

Specifically, the semiconductor band-pass filter 244 includes a semiconductor substrate 141C that is one example of the base, a semiconductor multilayer film 142C that is one example of the first semiconductor multilayer film and in which plural semiconductor layers having semiconductor materials are stacked, and a semiconductor multilayer film 145C that is one example of the second semiconductor multilayer film and in which plural semiconductor layers having semiconductor materials with different characteristics from the semiconductor multilayer film 142C are stacked.

That is, the semiconductor band-pass filter 244 has a structure in which the semiconductor multilayer film 142C in which the plural semiconductor layers having the semiconductor materials are stacked is formed on the semiconductor substrate 141C and the semiconductor multilayer film 145C in which the plural semiconductor layers having the semiconductor materials with different characteristics from the semiconductor multilayer film 142C are stacked is formed on the semiconductor multilayer film 142C. An anti-reflection film (AR coating) may be formed on the surfaces of the face oriented toward the side of the light receiver 15 in the semiconductor substrate 141C and the face oriented toward the side of the detection subject 21 in the semiconductor multilayer film 145C.

Effects of the photosensor 1 having the semiconductor band-pass filter 244 according to the modification example of the second embodiment are similar to those of the photosensor 1 according to the first embodiment.

Further, according to the semiconductor band-pass filter 244 of the modification example of the second embodiment, integration into one band-pass filter is allowed through forming the semiconductor multilayer film 145C on the semiconductor multilayer film 142C. Moreover, the semiconductor band-pass filter 244 can suppress the noise component of the received light by cutting off ambient light in a wavelength band in which cutoff by the semiconductor multilayer film 142C is not possible by use of the semiconductor multilayer film 145C having a high-pass filter or a low-pass filter.

Third Embodiment (Configuration of Band-Pass Filter)

A band-pass filter 14D according to a third embodiment will be described.

Figure 9:
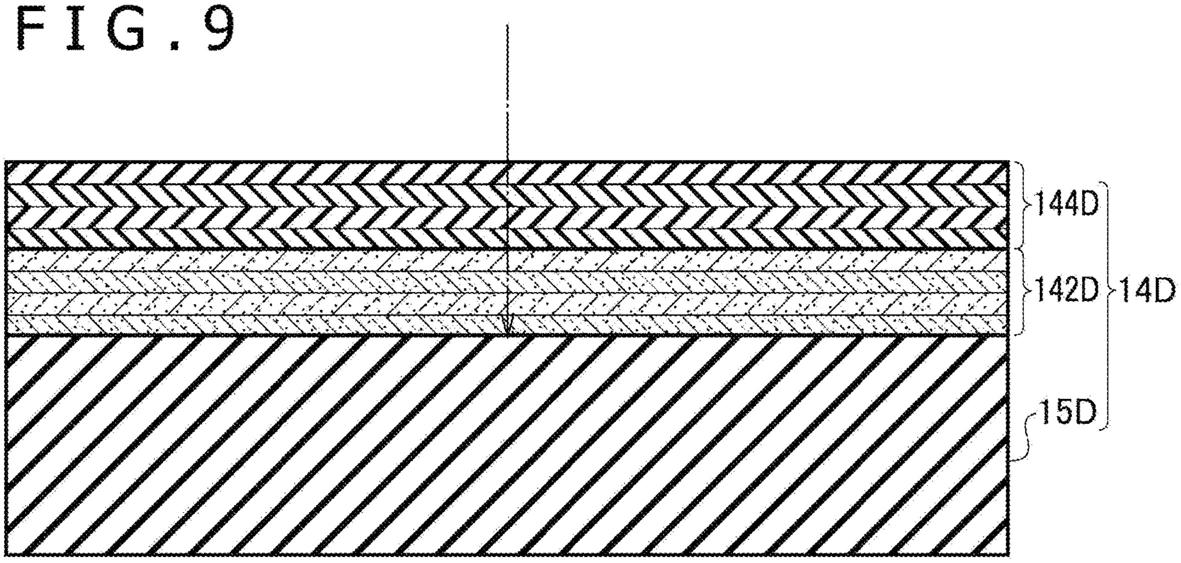
FIG. 9 is a configuration diagram illustrating a band-pass filter and a light receiver according to a third embodiment.

FIG. 9 is one example of a configuration diagram illustrating the band-pass filter 14D according to the third embodiment.

The band-pass filter 14D according to the third embodiment has a different configuration with respect to the band-pass filter 14A of FIG. 2 and the light receiver 15.

Specifically, the band-pass filter 14 and the light receiver 15 are separately configured in the photosensor according to the first embodiment, whereas the band-pass filter 14D according to the third embodiment includes a light receiver 15D as illustrated in FIG. 9. The configuration of the photosensor 1 other than the band-pass filter 14D and the light receiver 15D according to the third embodiment is the same as the photosensor 1 according to the first embodiment.

Further, the band-pass filter 14D includes the light receiver 15D that is one example of the base, a semiconductor multilayer film 142D that is one example of the first semiconductor multilayer film and in which plural semiconductor layers having semiconductor materials are stacked, and a dielectric multilayer film 144D in which plural dielectric layers having dielectric materials are stacked.

That is, the band-pass filter 14D has a structure in which the semiconductor multilayer film 142D in which the plural semiconductor layers having the semiconductor materials are stacked is formed on the light receiver 15D and the dielectric multilayer film 144D in which the plural dielectric layers having the dielectric materials are stacked is formed on the semiconductor multilayer film 142D. An anti-reflection film (AR coating) may be formed on the surface of the face oriented toward the side of the detection subject 21 in the dielectric multilayer film 144D.

Effects of the photosensor 1 having the band-pass filter 14D according to the third embodiment are similar to those of the photosensor 1 according to the first embodiment.

Further, according to the band-pass filter 14D of the third embodiment, the band-pass filter and the light receiver can be integrated into one component through forming the semiconductor multilayer film 142D and the dielectric multilayer film 144D over the light receiver 15D. Moreover, it is possible to suppress the noise component of the received light by cutting off ambient light in a wavelength band in which cutoff by the semiconductor multilayer film 142D of the band-pass filter 14D is not possible by use of the dielectric multilayer film 144D having a high-pass filter or a low-pass filter.

Modification Example of Third Embodiment (Configuration of Band-Pass Filter)

A band-pass filter 14E according to a modification example of the third embodiment will be described.

Figure 10:
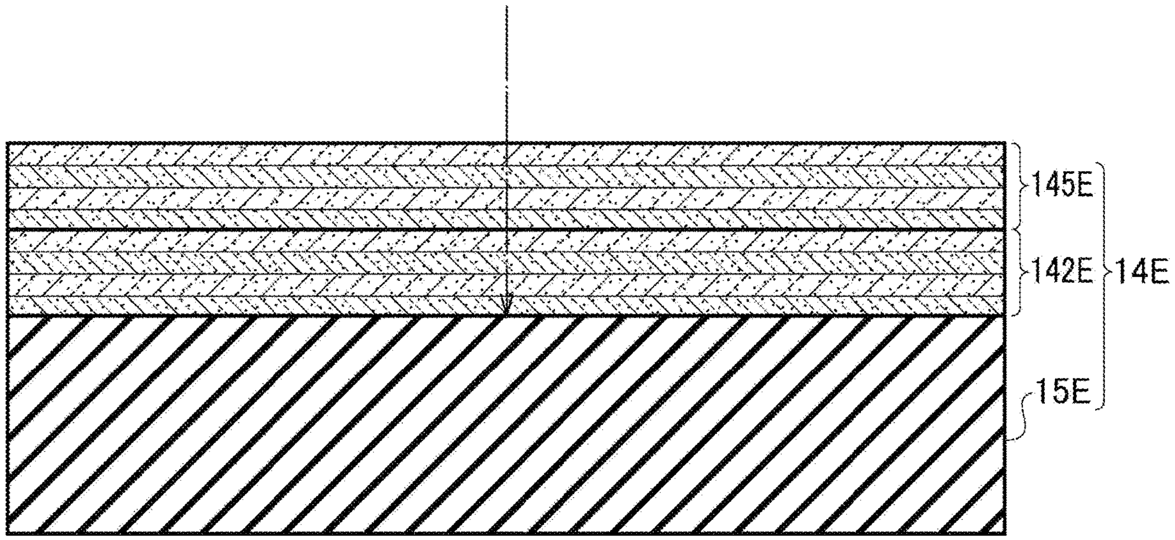
FIG. 10 is a configuration diagram illustrating a band-pass filter and a light receiver according to a modification example of the third embodiment.

FIG. 10 is one example of a configuration diagram illustrating the band-pass filter 14E according to the modification example of the third embodiment.

The band-pass filter 14E according to the modification example of the third embodiment has a different configuration with respect to the dielectric multilayer film 144D according to the third embodiment of FIG. 9.

Specifically, as illustrated in FIG. 10, the band-pass filter 14E according to the modification example of the third embodiment includes a semiconductor multilayer film 145E in which plural semiconductor layers having semiconductor materials with different characteristics from a semiconductor multilayer film 142E are stacked instead of the dielectric multilayer film 144D according to the third embodiment. The configuration of the photosensor 1 other than the band-pass filter 14E and the light receiver 15E according to the modification example of the third embodiment is the same as the photosensor 1 according to the first embodiment.

Further, the band-pass filter 14E includes a light receiver 15E that is one example of the base, the semiconductor multilayer film 142E that is one example of the first semiconductor multilayer film and in which plural semiconductor layers having semiconductor materials are stacked, and the semiconductor multilayer film 145E that is one example of the second semiconductor multilayer film and in which the plural semiconductor layers having the semiconductor materials with different characteristics from the semiconductor multilayer film 142E are stacked.

That is, the band-pass filter 14E has a structure in which the semiconductor multilayer film 142E in which the plural semiconductor layers having the semiconductor materials are stacked is formed on the light receiver 15E and the semiconductor multilayer film 145E in which the plural semiconductor layers having the semiconductor materials with different characteristics from the semiconductor multilayer film 142E are stacked is formed on the semiconductor multilayer film 142E. An anti-reflection film (AR coating) may be formed on the surface of the face oriented toward the side of the detection subject 21 in the semiconductor multilayer film 145E.

Effects of the photosensor 1 having the band-pass filter 14E according to the modification example of the third embodiment are similar to those of the photosensor 1 according to the first embodiment.

Further, according to the band-pass filter 14E of the modification example of the third embodiment, the band-pass filter and the light receiver can be integrated into one component through forming the semiconductor multilayer film 142E and the semiconductor multilayer film 145E over the light receiver 15E. Moreover, it is possible to suppress the noise component of the received light by cutting off ambient light in a wavelength band in which cutoff by the semiconductor multilayer film 142E of the band-pass filter 14E is not possible by use of the semiconductor multilayer film 145E having a high-pass filter or a low-pass filter.

OTHER EMBODIMENTS

As described above, the embodiments have been described. However, statements and drawings that form part of the disclosure are exemplary ones and should not be understood as what impose a limitation. Various alternative embodiments, working examples, and operation techniques will become apparent for those skilled in the art from this disclosure. As above, the embodiments according to the present disclosure include various embodiments and other examples that are not described here.

What is claimed is:

1. A photosensor that measures a state of a detection subject, the photosensor comprising:

a light source that emits irradiation light in a wavelength band including a specific peak wavelength to the detection subject;

a band-pass filter that allows the irradiation light directly reflected from the detection subject to be selectively transmitted through the band-pass filter;

a light receiver that receives the irradiation light transmitted through the band-pass filter; and a measuring device that measures the state of the detection subject by using the irradiation light received by the light receiver, wherein the light source has a temperature characteristic in which the specific wavelength peak of the emitted irradiation light shifts by a first wavelength shift amount depending on an environmental temperature, the band-pass filter has a temperature characteristic in which the specific wavelength peak of the emitted irradiation light shifts by a second wavelength shift amount depending on the environmental temperature, and a shape and a material of the band-pass filter are selected in such a manner that the second wavelength shift amount is equivalent to the first wavelength shift amount.

2. The photosensor according to claim 1, wherein the band-pass filter includes a semiconductor band-pass filter having a first semiconductor multilayer film formed of a plurality of semiconductor layers, and the semiconductor band-pass filter has a semiconductor substrate, and the first semiconductor multilayer film stacked on the semiconductor substrate.

3. The photosensor according to claim 2, wherein the band-pass filter further includes a dielectric band-pass filter having a dielectric multilayer film formed of a plurality of dielectric layers, and the dielectric band-pass filter has a dielectric substrate, and the dielectric multilayer film stacked on the dielectric substrate.

4. The photosensor according to claim 2, wherein the semiconductor band-pass filter further has a dielectric multilayer film formed of a plurality of dielectric layers, and the semiconductor band-pass filter has the dielectric multilayer film stacked on the first semiconductor multilayer film.

5. The photosensor according to claim 2, wherein the semiconductor band-pass filter further has a second semiconductor multilayer film in which a plurality of semiconductor layers having semiconductor materials with different characteristics from the first semiconductor multilayer film are stacked, and the semiconductor band-pass filter has the second semiconductor multilayer film stacked on the first semiconductor multilayer film.

6. The photosensor according to claim 1, wherein the band-pass filter has a semiconductor band-pass filter having a first semiconductor multilayer film formed of a plurality of semiconductor layers, and the first semiconductor multilayer film is disposed on a surface of the light receiver in the semiconductor band-pass filter.

7. The photosensor according to claim 6, wherein the semiconductor band-pass filter further has a dielectric multilayer film formed of a plurality of dielectric layers, and the semiconductor band-pass filter has the dielectric multilayer film stacked on the first semiconductor multilayer film.

8. The photosensor according to claim 6, wherein the semiconductor band-pass filter further has a second semiconductor multilayer film in which a plurality of semiconductor layers having semiconductor materials with different characteristics from the first semiconductor multilayer film are stacked, and the semiconductor band-pass filter has the second semiconductor multilayer film stacked on the first semiconductor multilayer film.

9. The band-pass filter included in the photosensor according to claim 1, the band-pass filter comprising:

a base;

a first layer in which a first refractive index layer is stacked on the base and a first stack layer is stacked on the first refractive index layer in a thickness direction;

a plurality of second layers in which a first cavity layer having a second refractive index higher than a first refractive index is stacked over the first layer, in which the first refractive index layer is stacked on the first cavity layer, and in which a second stack layer is stacked on the first refractive index layer;

a third layer in which a second cavity layer having the second refractive index is stacked on an uppermost layer in the plurality of second layers, in which the first refractive index layer is stacked on the second cavity layer, and in which a third stack layer is stacked on the first refractive index layer; and a cap layer stacked on the third layer, wherein shapes and materials of the first layer, the plurality of second layers, and the third layer are selected in such a manner that the second wavelength shift amount is equivalent to the first wavelength shift amount.

10. The band-pass filter according to claim 9, wherein the base includes at least either one of a semiconductor substrate or the light receiver.

11. The band-pass filter according to claim 9, wherein the first stack layer, the second stack layer, and the third stack layer have a first layered structure configured by a plurality of pairs of the first refractive index layer and a refractive index layer having the second refractive index, and the first refractive index layer is stacked on the refractive index layer having the second refractive index in the first layered structure.

* * * * *